(12) United States Patent
Dangelo et al.

(10) Patent No.: US 7,732,918 B2
(45) Date of Patent: Jun. 8, 2010

(54) VAPOR CHAMBER HEAT SINK HAVING A CARBON NANOTUBE FLUID INTERFACE

(75) Inventors: Carlos Dangelo, Los Gatos, CA (US); Jason Spitzer, San Jose, CA (US)

(73) Assignee: Nanoconduction, Inc., Sunnyvale, CA (US)

( * ) Notice: Subject to any disclaimer, the term of this patent is extended or adjusted under 35 U.S.C. 154(b) by 404 days.

(21) Appl. No.: 11/748,867

(22) Filed: May 15, 2007

(65) Prior Publication Data

US 2008/0128116 A1 Jun. 5, 2008

Related U.S. Application Data

(63) Continuation-in-part of application No. 11/498,408, filed on Aug. 2, 2006, which is a continuation of application No. 10/925,824, filed on Aug. 24, 2004, now Pat. No. 7,109,581, application No. 11/748,867, which is a continuation-in-part of application No. 11/386,254, filed on Mar. 21, 2006, now Pat. No. 7,477,527, application No. 11/748,867, which is a continuation-in-part of application No. 11/532,893, filed on Sep. 18, 2006, which is a continuation of application No. 10/925,824, application No. 11/748,867, which is a continuation-in-part of application No. 11/532,894, filed on Sep. 18, 2006, which is a continuation of application No. 10/925,824, application No. 11/748,867, which is a continuation-in-part of application No. 11/618,441, filed on Dec. 29, 2006.

(60) Provisional application No. 60/800,935, filed on May 16, 2006, provisional application No. 60/874,579, filed on Dec. 12, 2006, provisional application No. 60/908,966, filed on Mar. 29, 2007, provisional application No. 60/497,849, filed on Aug. 25, 2003, provisional application No. 60/663,225, filed on Mar. 21, 2005, provisional application No. 60/862,664, filed on Oct. 24, 2006.

(51) Int. Cl.
*H01L 23/34* (2006.01)

(52) U.S. Cl. ............... 257/722; 165/80.3; 257/E21.499; 257/E23.097; 257/E23.101; 257/706; 257/707; 257/721; 438/122; 977/932

(58) Field of Classification Search ................ 165/80.3; 257/706, 707, 721, 722, E23.097, E23.101, 257/E21.499; 438/122; 977/932
See application file for complete search history.

(56) References Cited

U.S. PATENT DOCUMENTS 4,466,618 A    8/1984    Angelini (Continued)

FOREIGN PATENT DOCUMENTS

EP    1329953    8/2003

(Continued)

OTHER PUBLICATIONS

Iijima, et al., "Single-shell carbon nanotubes of 1-nm diameter", Nature 363, 603 (1993).

(Continued)

*Primary Examiner*—Asok K Sarkar
(74) *Attorney, Agent, or Firm*—Williams, Morgan & Amerson, P.C.

(57) ABSTRACT

An enhanced heat transposer comprised is of a vapor chamber. The surface of the vapor chamber that holds the fluid comprises an array of carbon nanotubes (CNTs) that are grown in a way that enables the fluid to come into maximum contact with the CNTs. The fluid evaporates in the sealed vapor chamber when it is in touch with a hot surface. The vapor comes in contact with a hollow pin-fin structure that provides additional surface area for vapor cooling and heat transfer. The condensed vapor then drops back into the fluid container, and the cycle continues.

32 Claims, 3 Drawing Sheets

U.S. PATENT DOCUMENTS

| | | | |
|---|---|---|---|
| 4,932,052 A | 6/1990 | Lo |
| 5,060,543 A | 10/1991 | Warheit |
| 5,217,094 A | 6/1993 | Walter et al. |
| 5,713,690 A | 2/1998 | Corbin, Jr. et al. |
| 5,808,236 A | 9/1998 | Brezina et al. |
| 5,818,700 A | 10/1998 | Purinton |
| 5,837,081 A | 11/1998 | Ting |
| 5,932,925 A | 8/1999 | McIntyre |
| 5,965,267 A | 10/1999 | Nolan |
| 5,990,552 A | 11/1999 | Xie et al. |
| 6,156,256 A | 12/2000 | Kennel |
| 6,180,874 B1 | 1/2001 | Brezina et al. |
| 6,231,744 B1 | 5/2001 | Ying |
| 6,232,706 B1 | 5/2001 | Dai |
| 6,340,822 B1 | 1/2002 | Brown |
| 6,359,288 B1 | 3/2002 | Ying |
| 6,361,861 B2 | 3/2002 | Gao |
| 6,373,703 B2 | 4/2002 | Johnson et al. |
| 6,383,923 B1 | 5/2002 | Brown |
| 6,395,991 B1 | 5/2002 | Dockerty et al. |
| 6,407,922 B1 | 6/2002 | Eckblad |
| 6,417,563 B1 | 7/2002 | Halderman et al. |
| 6,432,740 B1 | 8/2002 | Chen |
| 6,449,155 B1 | 9/2002 | Colbert et al. |
| 6,504,292 B1 | 1/2003 | Choi |
| 6,591,658 B1 | 7/2003 | Yedur |
| 6,618,251 B2 | 9/2003 | Ishimine |
| 6,713,151 B1 | 3/2004 | Dean |
| 6,724,906 B2 | 4/2004 | Naksen et al. |
| 6,756,026 B2 | 6/2004 | Colbert |
| 6,800,886 B2 | 10/2004 | Awano |
| 6,821,415 B2 | 11/2004 | Sharb |
| RE38,677 E | 12/2004 | Blomquist |
| 6,853,068 B1 | 2/2005 | Djekic |
| 6,855,376 B2 | 2/2005 | Hwang |
| 6,856,016 B2 | 2/2005 | Searls |
| 6,856,511 B1 | 2/2005 | Viernes et al. |
| 6,859,367 B2 | 2/2005 | Davison |
| 6,862,962 B1 | 3/2005 | Delbrugge et al. |
| 6,864,571 B2 | 3/2005 | Arik |
| 6,880,799 B2 | 4/2005 | Mrozek |
| 6,891,724 B2 | 5/2005 | De Lorenzo |
| 6,892,652 B2 | 5/2005 | Jalbert et al. |
| 6,900,580 B2 | 5/2005 | Dai |
| 6,910,666 B2 | 6/2005 | Burr |
| 6,921,462 B2 | 7/2005 | Montgomery |
| 6,924,335 B2 | 8/2005 | Fan |
| 6,955,800 B2 | 10/2005 | Resasco et al. |
| 6,962,823 B2 | 11/2005 | Empedocles |
| 6,965,513 B2 | 11/2005 | Montgomery |
| 6,989,325 B2 | 1/2006 | Uang |
| 6,998,358 B2 | 2/2006 | French et al. |
| 7,008,604 B2 | 3/2006 | Smalley |
| 7,011,771 B2 | 3/2006 | Gao |
| 7,029,646 B2 | 4/2006 | Margrave |
| 7,033,647 B2 | 4/2006 | Tang et al. |
| 7,052,666 B2 | 5/2006 | Colbert |
| 2002/0090501 A1 | 7/2002 | Tobita |
| 2002/0100581 A1 | 8/2002 | Knowles |
| 2002/0130407 A1 | 9/2002 | Dahl |
| 2002/0145194 A1 | 10/2002 | O'Connor |
| 2002/0163079 A1 | 11/2002 | Awano |
| 2003/0111333 A1 | 6/2003 | Montgomery |
| 2003/0117770 A1 | 6/2003 | Montgomery |
| 2003/0231471 A1 | 12/2003 | De Lorenzo |
| 2004/0005736 A1 | 1/2004 | Searls |
| 2004/0013598 A1 | 1/2004 | McElrath |
| 2004/0053053 A1 | 3/2004 | Jiang |
| 2004/0101468 A1 | 5/2004 | Liu |
| 2004/0136161 A1 | 7/2004 | Miyamura et al. |
| 2004/0146560 A1 | 7/2004 | Whiteford |
| 2004/0150100 A1 | 8/2004 | Dubin |
| 2004/0152240 A1 | 8/2004 | Dangelo |
| 2004/0182600 A1 | 9/2004 | Kawabata |
| 2004/0184241 A1 | 9/2004 | De Lorenzo |
| 2004/0191158 A1 | 9/2004 | Liu |
| 2004/0218362 A1 | 11/2004 | Amaro |
| 2004/0261978 A1 | 12/2004 | Zhan |
| 2004/0261987 A1 | 12/2004 | Zhang |
| 2004/0265489 A1 | 12/2004 | Dubin |
| 2004/0266063 A1 | 12/2004 | Montgomery |
| 2004/0266065 A1 | 12/2004 | Zhang |
| 2005/0006754 A1 | 1/2005 | Arik |
| 2005/0037204 A1 | 2/2005 | Osiander |
| 2005/0046017 A1 | 3/2005 | Dangelo |
| 2005/0061496 A1 | 3/2005 | Matabayas |
| 2005/0067693 A1 | 3/2005 | Nihei |
| 2005/0092464 A1 | 5/2005 | Leu |
| 2005/0116336 A1 | 6/2005 | Chopra |
| 2005/0136248 A1 | 6/2005 | Leu |
| 2005/0139642 A1 | 6/2005 | Koning |
| 2005/0139991 A1 | 6/2005 | White |
| 2005/0150887 A1 | 7/2005 | Taya |
| 2005/0167647 A1 | 8/2005 | Huang |
| 2005/0224220 A1 | 10/2005 | Li |
| 2005/0238810 A1 | 10/2005 | Scaringe |
| 2005/0260412 A1 | 11/2005 | Gardner |
| 2005/0269726 A1 | 12/2005 | Matabayas, Jr. |
| 2008/0003801 A1* | 1/2008 | Dubin et al. ............... 438/599 |
| 2009/0065176 A1* | 3/2009 | Hannah et al. ............. 165/80.3 |

FOREIGN PATENT DOCUMENTS

| | | |
|---|---|---|
| WO | WO 03/054958 | 7/2003 |
| WO | WO 03/072679 | 9/2003 |
| WO | WO 03/107419 | 12/2003 |

OTHER PUBLICATIONS

Baughman, et al.; "Carbon Nanotubes—the Route Toward Applications", W A, Science 297, 787 (2002).

Wong, et al.; "Nanobeam Mechanics: Elasticity, Strength, and Toughness of Nanorods and Nanotubes", Science 277, 1971 (1997).

Yu, et al.; "Tensile Loading of Ropes of Single Wall Carbon Nanotubes and their Mechanical Properties", Phys. Rev. Lett. 84 5552 (2000).

Odom, et al.;"Atomic structure and electronic properties of single-walled carbon nanotubes", Nature 391, 62 (1998).

Wildoer, et al.;"Electronic structure of Atomically resolved carbon nanotubes", Nature, 391, 59(1998).

Li, J. et al. "Bottom Up Approach for Carbon Nanotube Interconnects." Applied Phys. Letters, American Institute of Physics, Apr. 18, 2003, pp. 2491-2493, vol. 82, No. 15.

Baughman, et al.;"Carbon Nanotube Actuators", Science 284, 1340 (1999).

Star. et al; "Nano Optoelectronic Memory Devices", Nano Lett. 4, 1587 (2004).

Lee, et al.;"Bandgap Modulation of Carbon Nanotubes by Encapsulated Metallofullerenes", pp. 1005-1008.

Collins, et al.; "Engineering Carbon Nanotubes and Nanotube Circuits Using Electrical Breakdown", Science 292, 706 (2001).

Bachtold, et al.; "Logic Circuits with Carbon Nanotube Transistors", Science 294, 1317 (2001).

Koehne, et al.;"Ultrasensitive label-free DNA analysis using an electronic chip based on carbon nanotube nanoelectrode arrays", Nanotechnology, 14 , 1239 (2003).

Kong, et al.; "Nanotube Molecular Wires as Chemical Sensors", Science 287, 622 (2000).

Li, et al.;"Carbon Nanotube Sensors for Gas and Organic Vapor Detection", Nano Lett. 3, 929 (2003).

Novak, et al.;"Nerve agent detection using networks of single-walled carbon nanotubes", Appl. Phys. Lett. 83, 4026 (2003).

Ruoff, et al.; "Mechanical and Thermal Properties of Carbon Nanotubes", Carbon 33, 925 (1995).

Fujii, et al.;"Measuring the Thermal Conductivity of a Single Carbon Nanotube", Phys. Rev. Lett. 95, 065502 (2005).

Kim, et al.; "Thermal Transport Measurements of Individual Multiwalled Nanotubes", Phys. Rev. Lett.87 215502 (2001).

Pop, et al.;"Thermal Conductance of an Individual Single-Wall Carbon Nanotube above Room Temperature", Nano Lett. 6, 96 (2006).

Xu, et al.; "Enhancement of Thermal Interface Materials with Carbon Nanotube Arrays," International Journal of Heat and Mass Transfer, vol. 49, pp. 1658-1666, (2006).

Yu, et al.; "Thermal Contact Resistance and Thermal Conductivity of a Carbon Nanofiber", J. Heat. Tran. 2006, 128, 234.

Wang, et al.; "Photo-Acoustic Measurement of Thermal Conductivity of Thin Films and Bulk Materials", ASME, J. Heat Transfer, 123, 138 (2001).

Dresselhaus, et al.;"Raman spectroscopy on one isolated carbon nanotube", Physica B. 232, 15 (2002).

Dresselhaus, et al.; "Phonons in carbon nanotubes", Adv. Phys. 49, 705 (2000).

Markutsya, et al.; "Freely Suspended Layer-by-layer Nanomembranes: Testing Micrormechanical Properties", pp. 771-780, (2005).

Brown, et al.; "Anti-Stokes Raman spectra of single-walled carbon nanotubes", Phys. Rev. B. 61, 5137 (2000).

Jorio, et al.; "Structural (n,m) Determination of Isolated Single-Wall Carbon Nanotubes by Resonant Raman Scattering", Phys. Rev. Lett. 86, 1118 (2001).

Sullivan, et al.;"An Experimental and Theoretical Study of Transient Negative Ions in Mg, Zn, Cd, and Hg", pp. 159.1-159.26, (2003).

Popov, et al.; "Carbon nanotubes: properties and application", Mat. Sci. Eng. R, 43, 61, (2004).

Bachtold, et al.; "Contacting carbon nanotubes selectively with low-ohmic contacts for four-probe electric measurements", Appl. Phys. Lett. 73, 274, (1998).

Zhang, et al.; "Heterostructures of Single-Walled Carbon Nanotubes and Carbide Nanorods", Science, 285, 1719 (1999).

Lee, et al.; "Formation of low-resistance ohmic contacts between carbon nanotube and metal electrodes by a rapid thermal annealing method", J. Phys. D. Appl. Phys, 33, 1953 (2000).

Terekhov, et al.; "Laser heating method for estimation of carbon annotube purity", Appl. Phys. A, 74, 393 (2002).

Terekhov, et al.; "Calibration of Raman-Based Method for Estimation of Carbon Nanotube Purity", AIP Proc. 685, 116 (2003).

E. Suhir, "'1Bimaterial assembly with a low modulus bonding layer at the ends", Journal of Applied Physics, 93, 3657, (2003).

Treacy, et al.; "Exceptionally high Young's modulus observed for individual carbon nanotubes", Lett Nature, 381, 678, (1996).

Yao, et al.;"Young's Modulus of Single Walled Carbon Nanotubes", J. Appl. Phys., 84(4):1939-1943, (1998).

Hernandez, et al.; "Elastic Properties of c and bxcynz Composite Nanotubes", Phys. Rev. Lett., 80(20):4502-4505, (1998).

Krishnan, et al.; "Young's Modulus of Single Walled Nanotubes", Phys. Rev. B. 58(20):14013-14019, (1998).

Poncharal, et al.; "Electrostatic Deflections and Electromechanical Resonances of Carbon Nanotubes" Science, 283, 1513 (1999).

Gaillard, et al.; 2005, "Mechanical properties of chemical vapor deposition-grown multiwalled carbon nanotubes", Applied Physics Letters, vol. 86, No. 23 (2005).

Wei, et al.; 2004, "Nanomechanics of carbon nanofibers: structural and elastic properties", Applied Physics Letters, vol. 85, No. 12, pp. 2208-2210 (2004).

Salvetat, et al.; "Elastic Modulus of Ordered and Disordered Multi-Walled Carbon Nanotubes", Adv. Mater. 11(2):161-165, (1999).

Cao, et al.; "Super compressible foam like carbon nanotube films", Science, 310, 1307 (2005).

Xin et al.; "Strain Energy and Young's Modulus of Single-Wall Carbon Nanotubes Calculated From Electronic Energy-Band Theory", Phys. Rev., B, 62(20):13692-13696, (2000).

Ru, C.Q., "Effective Bending Stiffness of Carbon Nanotubes", Phys. Rev. B. 62(15):9973-9976, (2000).

Yu et. al., "Strength and Breaking Mechanism of Multiwalled Carbon Nanotubes Under Tensile Load", Science, 287, 637 (2000).

Kuzumaki et. al., "Dynamic measurement of electrical conductivity of carbon nanotubes during mechanical deformation by nanoprobe manipulation in transmission electron microscopy", Appl. Phys. Lett. 85, 1250 (2004).

Nishio et. al.; "Buckling Test under Axial Compression for Multiwall Carbon Nanotubes", Jpn. J. Appl. Phys. 44, L1097 (2005).

Govindjee, et al.; "On the Use of Continuum Mechanics to Estimate the Properties of Nanotubes", Solid State Comm., 110(4):227-230, (1999).

Harik, V.M.; "Ranges of Applicability for the Continuum Beam Model in the Mechanics of Carbon Nano-Tubes and Nano-Rods", Solid State Comm, 120(331-335), (2001).

Lourie, et al.; "Buckling and Collapse of Embedded Carbon Nanotubes", Phys. Rev. Letters, 81(8): 1638-1641, (1988).

Falvo, et al; "Bending and Buckling of Carbon Nanotubes Under Large Strain", Nature, 389 (6651): 582-584, (1997).

Ru, C.Q.; "Effect of van der Waals Forces on Axial Buckling of a Double-Walled Carbon Nanotube", J.Appl.Phys., 87(10):7227-7231, (2000).

Ru, C.Q.; "Column Buckling of Multi-Walled Carbon Nanotubes with Interlayer Radial Displacements", Phys. Rev., B, 62(24):16962-16967, (2000).

Ru, C.Q.; "Degraded Axial Buckling Strain of Multi-Walled Carbon Nanotibes due to Interlayer Slips", J. Appl. Physics, 89(6):3426-3433, (2001).

Wang, et al.;"Axially Compressed Buckling of Pressured Multiwall Carbon Nanotubes", pp. 3893-3911, (2002).

Ru, C.Q.; "Elastic Buckling of Single Walled Carbon Nanotube Ropes Under High Pressure", Phys. Rev., B. 62(15):10405-10408, (2000).

Cruden, et al.; "Reactor design considerations in the hot filament/direct current plasma synthesis of carbon nanofibers", J. Appl. Phys., 94, 4070, (2003).

Li, J. et al. "Electronic Properties of Multiwalled Carbon Nanotubes in an Embedded Vertical Array." Applied Physics Letters, vol. 81, No. 15, Jul. 29, 2002, pp. 910-912.

Cui, et al.;"Growth of Carbon Nanofibers on Tipless Cantilevers for High Resolution Topography and Magnetic Force Imaging", Nano Lett. 4, 2157 (2004).

Chen, et al.; "Extremely Sharp carbon nanocone probes for atomic force microscopy imaging", Appl. Phys. Lett. 88, 153102 (2006).

E. Suhir, "Analysis of Interfacial Thermal Stresses in a Tri-Material Assembly", Journal of Applied Physics, 89, 3685 (2001).

Banerjee, K. et al. "3-D Heterogeneous ICs: a Technology for the Next Decade and Beyond." 5th IEEE Workshop on Signal propagation on Interconnects, Venice, Italy, May 13-15, 2001.

Berber et al. "Unusually High Thermal Conductivity of Carbon Nanotubes, Physical Review Letters." May 15, 2000, pp. 4613-4616, vol. 84, No. 20.

Cassell, a. "Direct Growth of Free-standing single-Walled Carbon Nanotubes." J. Am. Chemical society, 1999, 121, pp. 7975-7976.

Chiang, T.Y. "A New Analytical Thermal Model for Multilevel ULSI Interconnects Incorporating Via Effect." Center for Integrated Systems, Stanford University.

Chiang, T.Y. "Effect of Via Separation and Low-k Dielectric Materials on the Thermal Characteristics of Cu Interconnects." IEDM 2000.

Cui, Y. et al. "Doping and Electrical Transport in Silicon Nanowires." Journal of Physical Chemistry, vol. 104, No. 22, Jun. 8, 2000, pp. 5213-5216.

de Pablo, P.J. "A Simple, Reliable Technique for Making Electrical Contact to Multiwalled Carbon Nanotubes." Applied Physics Letters, vol. 74, No. 2, Jan. 11, 1999, pp. 323-325.

Delzeit, L. et al. "Growth of Carbon Nanotubes by Thermal and Plasma Chemical Vapour Deposition Processes and Applications in Microscopy." Nanotechnology, vol. 13, May 23, 2002, pp. 280-284.

Delzeit, L. et al. "Growth of Multiwall Carbon Nanotubes in an Inductively Coupled Plasma Reactor." Journal of Applied Physics, vol. 91, No. 9, May 1, 2002, pp. 6027-6033.

Goodson, K.E. et al. "Improved Heat Sinking for Laser-Diode Arrays Using Microchannels in CBD Diamond." IEE Transactions on Components, Packaging, and Manufacturing Technology, Part B, Advanced Packaging, vol. 20, Issue 1, Feb. 1997, pp. 104-109.

Hone, J. et al. "Thermoelectric Power of Single-Walled Carbon Nanotubes." Physical Review Letters, vol. 80, No. 5, Feb. 2, 1998, pp. 1042-1045.

Huang, Z.P. et al. "Growth of Highly Oriented Carbon Nanotubes by Plasma-Enhanced Hot Filament Chemical Vapor Deposition." Applied Physics Letters, vol. 73, No. 26, Dec. 28, 1998, pp. 3845-3847.

International Semiconductor Road Map (ITRS-2001), Section on Interconnect, http://public/itrs.net/files/2001ITRS/interconnect.pdf.

Kim, M.J. et al. "Growth Characteristics of Carbon Nanotubes via Aluminum Nanopore Template on Si Substrate Using PECVD." Elsevier Thin Solid Films, vol. 425, 2003, pp. 312-317.

Kong, J. et al. "Synthesis of Individual Single-Walled Carbon Nanotubes on Patterned Silicon Wafers." Nature, vol. 395, Oct. 29, 1998, pp. 878-881.

Kurabayashi, K. et al. "Precision Measurement and Mapping of die-attach Termal Resistance." IEEE Transactions on Components, Packaging, and Manufacturing Technology, Part A: Advanced Packaging, vol. 21, Issue 3, Sep. 1998, pp. 506-514.

Li, J. et al. "Controlled Deposition of Individual Single-Walled Carbon Nanotubes on Chemically Functionalized Templates." Chemical Physics Letters, 303, Apr. 2, 1999, pp. 125-129.

McEuen, P.L. et al. "Single-walled Carbon Nanotube Electronics." IEEE Transactions on Nanotechnology, vol. 1, No. 1, Mar. 2002, pp. 78-85.

Meyyappan, M. et al. "Carbon Nanotube Growth by PECVD: a Review." Plasma Sources Science and Technology, vol. 12, Apr. 2, 2003, pp. 205-216.

Ren, Z.F., et al., "Synthesis of Large Arrays of Well-Aligned Carbon Nanotubes on Glass." Science, vol. 282, Nov. 6, 1998, pp. 1105-1107.

Shi, L. "A Microdevice for Measuring Thermophysical Properties of Nanowires and Nanotubes." 2001 ASME International Mechanical Engineering Congress and Exposition, Nov. 11-16, 2001, pp. 359-362.

Shi, L. "Scanning Thermal Microscopy of Carbon Nanotubes Using Batch-Fabricated Probes." Applied Physics Letters, vol. 77, No. 26, Dec. 25, 2000, pp. 4295-4297.

Stevens, R. "Improved Fabrication Approach for Carbon Nanotube Probe Devices." Applied Physics Letters, vol. 77, No. 21, Nov. 20, 2000, pp. 3453-3455.

Sun, X. et al. "Theoretical Modeling of Thermoelectricity in Bi Nanowires." Applied Physics Letters, vol. 74, No. 26, Jun. 28, 1999, pp. 4005-4007.

Tu et al. "Growth of Aligned Carbon Nanotubes with Controlled Site Density." Applied Phys. Letters, American Institute of Physics, May 27, 2002, pp. 4018-4020, vol. 80, No. 21.

Yakobson, B.I. et al. "Fullerene Nanotubes: C1,000,000 and Beyond." American Scientist online, http://www.americanscientist,org/template/AssetDetail/assetid/2870?fulltext=true&print=yes.

Zhang, "Formation of Metal Nanowires on Suspended Single-Walled Carbon Nanotubes." Appl. Phys. Lett., vol. 77(19), p. 3015 (2000.

Zhang, W.D. et al. "Synthesis of Vertically Aligned Carbon Nanotubes Films on Silicon Wafers by Pyrolysis of Ethylenediamine." Elsevier, Thin Solid Films, 422, 2002, pp. 120-125.

Zhang, Y. et al. "Electric-Field-Directed Growth of Aligned single-Walled Carbon Nanotubes." Applied Physics Letters, vol. 79, No. 19, Nov. 5, 2001, pp. 3155-3157.

Zhou, P. et al. "Thermomechanical diagnostics of FLIP-CHIP/BGA Structures Using Phase-Shifting Electronic Speckle Pattern Interferometry." EEP, Advances in Electronic Packaging, vol. 26-2, ASME, 1999, pp. 1875-1880.

* cited by examiner

US 7,732,918 B2

VAPOR CHAMBER HEAT SINK HAVING A CARBON NANOTUBE FLUID INTERFACE

CROSS REFERENCE TO RELATED APPLICATIONS

This application claims the benefit of: (A) U.S. provisional patent application Ser. No. 60/800,935, filed May 16, 2006, entitled Small-size coupons and bonded assemblies for CNT-based thermal management of IC devices; (B) U.S. provisional patent application Ser. No. 60/874,579, filed Dec. 12, 2006, entitled Carbon nanotube-based structures and methods for removing heat from solid-state devices; and (C) U.S. provisional patent application Ser. No. 60/908,966, filed Mar. 29, 2007, entitled Double layer carbon nano-tube-based structures and methods for removing heat from solid-state devices; each of which of these patent applications is incorporated herein in its entirety by this reference thereto.

This application is a continuation-in-part of: (A) U.S. patent application Ser. No. 11/498,408, filed Aug. 2, 2006, which is a continuation of U.S. patent application Ser. No. 10/925,824, filed Aug. 24, 2004 which, in turn, claims benefit of U.S. provisional patent application Ser. No. 60/497,849 filed Aug. 25, 2003; (B) U.S. patent application Ser. No. 11/386,254, filed Mar. 21, 2006 now U.S. Pat. No. 7,477,527 entitled Apparatus for attaching a cooling structure to an integrated circuit which, in turn, claims the benefit of U.S. provisional patent application Ser. No. 60/663,225, filed Mar. 21, 2005; (C) U.S. patent application Ser. No. 11/532,893, filed Sep. 18, 2006 entitled Integrated circuit micro-cooler having tubes of a CNT array in essentially the same height over a surface", which is a continuation of U.S. patent application Ser. No. 10/925,824, filed Aug. 24, 2004 which, in turn, claims benefit of U.S. provisional patent application Ser. No. 60/497,849 filed Aug. 25, 2003; (D) U.S. patent application Ser. No. 11/532,894, filed Sep. 18, 2006, entitled An integrated circuit micro-cooler with double-sided tubes of a CNT array, which is a continuation of U.S. patent application Ser. No. 10/925,824, filed Aug. 24, 2004 which, in turn, claims benefit of U.S. provisional patent application Ser. No. 60/497, 849, filed Aug. 25, 2003; and (E) U.S. patent application Ser. No. 11/618,441, filed Dec. 29, 2006, entitled Method and apparatus for the evaluation and improvement of mechanical and thermal properties of CNT/CNF arrays which, in turn, claims the benefit of U.S. provisional patent application Ser. No. 60/862,664, filed Oct. 24, 2006, each of which of these patent applications is incorporated herein in its entirety by this reference thereto.

BACKGROUND OF THE INVENTION

1. Field of Invention

The invention relates to heat sinks. More specifically, the invention relates to heat sink comprising a vapor chamber.

2. Discussion of the Prior Art

State of the art heat sinks have the ability to transfer heat from a hot surface. Some of these heat sinks have a vapor chamber comprising a sealed compartment that contains a fluid. The fluid container is contacted to a hot surface, causing the fluid to boil. Vapors of the fluid expand and come in contact with a cool surface of the vapor chamber and condense on that surface, thereby transferring heat to that surface. As a result, heat is transferred from the hot surface to the cooler surface, thereby cooling the hot surface.

A primary aim of the various known solutions is to provide a low resistance path from the hot surface to the cool surface, so that heat is transferred from the hot surface as efficiently and effectively as possible. This is of particular importance in, for example, semiconductor devices where, at relatively low surface temperatures, the structures may be permanently damaged by excess heat.

Various designs and methods are provided in the prior art to achieve better contact between the hot surface and the vapor chamber.

Mok et al. suggest, in U.S. Pat. Nos. 7,180,179 and 7,002, 247, a thermal interposer for the thermal management of semiconductor devices. The interposer comprises of an upper and lower plates, where both the upper and lower plates have grooves. The walls created by the lower plate extend to within less than 250 microns from the walls of the upper plate, thereby forming the separation required for the creation of a vapor chamber. In one embodiment of Mok et al., a section of the wick structure, e.g. grooves, and walls of the upper plate and/or the lower plate are covered with a layer of graphite foam, graphite fiber, or carbon nanotubes. Mok et al. note, specifically, that the upper plate and/or the lower plate are made of silicon, and the surfaces of the wick structure are further processed to deposit or otherwise add anisotropic graphite foam, graphite fiber, or carbon nanotubes (CNTs) onto them. In various embodiments, the graphite foam, graphite fiber, or CNTs cover some or all of the wick structures. Accordingly, this added layer of material increases the surface area to provide increased wicking action to return the vapor chamber fluid to the semiconductor chip where it is vaporized. Furthermore, the high thermal conductivity of the graphite foam, graphite fiber, or CNTs increases the performance of the Mok et al. thermal interposer. Unfortunately, the Mok et al. invention suffers from several deficiencies. First, growing CNTs on an uneven surface that comprises grooves is complex due to different growth orientations. Second, attachment of the CNTs to the surface is not guaranteed due to the uneven surface. Third, a dense population of CNTs may result in a limited ability of the fluid to make actual contact with a maximal surface area of CNTs, thereby loosing its effectiveness. Last, the length of the CNTs is limited due to the 250 microns or less distance between the walls, further reducing the possible effective surface area coming into contact with the vapor fluid.

Therefore, due to the limitations and/or deficiencies of the prior art, it would be advantageous to provide a vapor chamber heat sink that benefits from the use of CNTs as an effective heat conducting medium.

SUMMARY OF THE INVENTION

An enhanced heat transposer comprised is of a vapor chamber. The surface of the vapor chamber that holds the fluid comprises an array of carbon nanotubes (CNTs) that are grown in a way that enables the fluid to come into maximum contact with the CNTs. The fluid evaporates in the sealed vapor chamber when it is in touch with a hot surface. The vapor comes in contact with a hollow pin-fin structure that provides additional surface area for vapor cooling and heat transfer. The condensed vapor then drops back to the fluid container, and the cycle continues.

DETAILED DESCRIPTION OF A PREFERRED EMBODIMENT OF THE INVENTION

The presently preferred embodiment of the invention provides an enhanced heat transposer comprised of a vapor chamber. The surface of the vapor chamber that holds the fluid comprises an array of carbon nanotubes (CNTs) that are grown in a way that enables the fluid to come into maximum contact with the CNTs. The fluid evaporates in the sealed vapor chamber when it is in touch with a hot surface. The resulting vapor comes in contact with a hollow pin-fin structure that provides additional surface for vapor cooling and heat transfer. The condensed vapor then drops back to the fluid container, and the cycle continues.

Figure 1A:
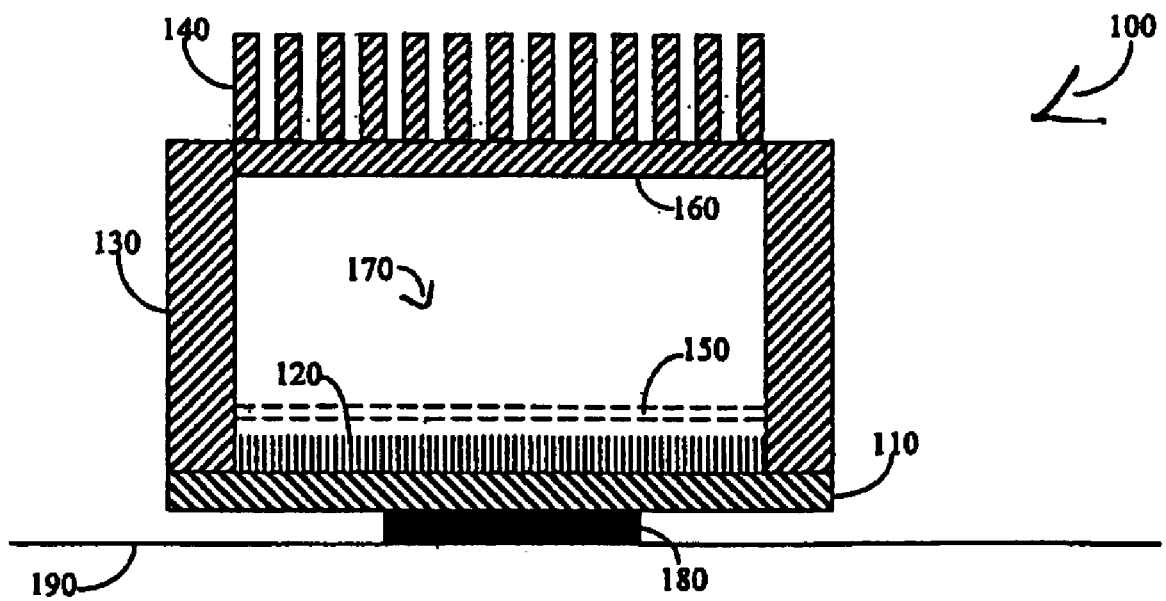
FIG. 1A is a side view in a schematic form of a first embodiment of a vapor chamber heat sink according to the invention.
Figure 1B:
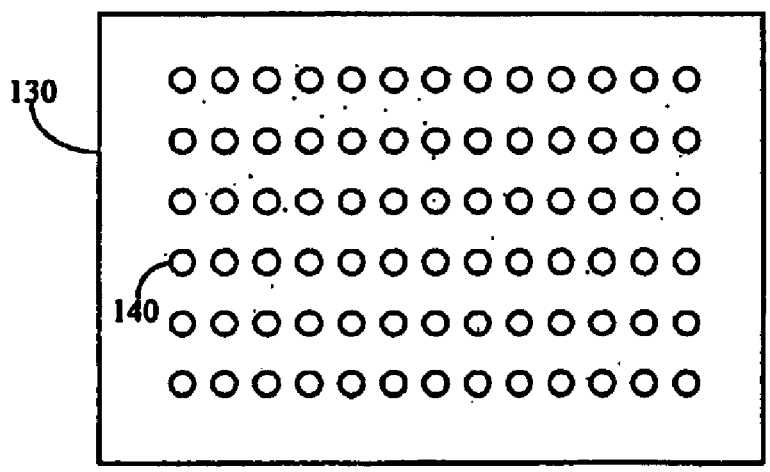
FIG. 1B is an upper view in schematic form of the first embodiment shown in FIG. 1A.

FIGS. 1A and 1B show a first embodiment of a vapor chamber heat sink 100 according to the invention. The heat sink 100 comprises a substrate 110 and an encapsulating structure 130 that, when attached to the substrate 110 and sealed, forms a vapor chamber 170. A typical substrate thickness is between 2 and 15 millimeters. Prior to sealing, a vapor fluid 150 is added to a desired level into the vapor chamber 170. The substrate 110 is adapted to be attached to a hot surface 180 which may be, for example, an integrated circuit (IC) mounted on a printed circuit board (PCB) 190. The substrate 110 is preferable a metallic material, such as copper or a copper alloy, that ensures good heat conductivity, or otherwise low heat resistance, between the hot surface 180 and the substrate 110.

In some embodiments of the invention, the substrate 110 can be configured as a heat spreader. Heat spreaders are typically configured in the art as a copper cup covering a solid state device. Heat spreaders are used to provide mechanical support in flip chip packages for integrated circuit (IC) processors, that include but are not limited to, general purpose, embedded, or graphics processors. One benefit of such structure is that it spreads the heat to a larger heat sink attached to the spreader.

On a surface of the substrate 110 which is inside the vapor chamber 170, CNTs 120 are grown such that the CNTs 120 have a specific aspect ratio of length over diameter, a specific length, an optimal density, i.e. the number of CNTs per square micron. Accordingly, the array or forest of CNTs 120 has a minimum thermal conductivity and an increased surface area for enhanced heat transfer. The CNTs 120 are preferably grown separately of each other to provide for such conditions. An exemplary implementation of such methods of growth are shown in U.S. Pat. No. 7,109,581 by Dangelo et al., entitled System and Method Using Self-Assembled Nano Structures in the Design and Fabrication of an Integrated Circuit Micro-Cooler (the "581 patent"), assigned to common assignee, and which is hereby incorporated in its entirety by this reference thereof. In one embodiment, long CNTs, for example CNTs having lengths between 100 and 700 microns, are used to help break the boundary layer for improved heat transfer. In another embodiment, the CNTs are of lengths which is greater than 700 microns.

In one embodiment, the CNTs 120 are coated with a thin layer of, for example, titanium, palladium, or platinum, to increase heat conductivity between the CNTs 120 and the vapor fluid 150. In another embodiment, pin fins 140 are attached to the outer surface of the encapsulating structure 130, the outer surface being opposite to the substrate 110. A top view of the pin fin array is shown in FIG. 1A. An advantage of using a pin fin array is that it provides a system that removes heat more efficiently from the larger surface area that such structures have.

Figure 2:
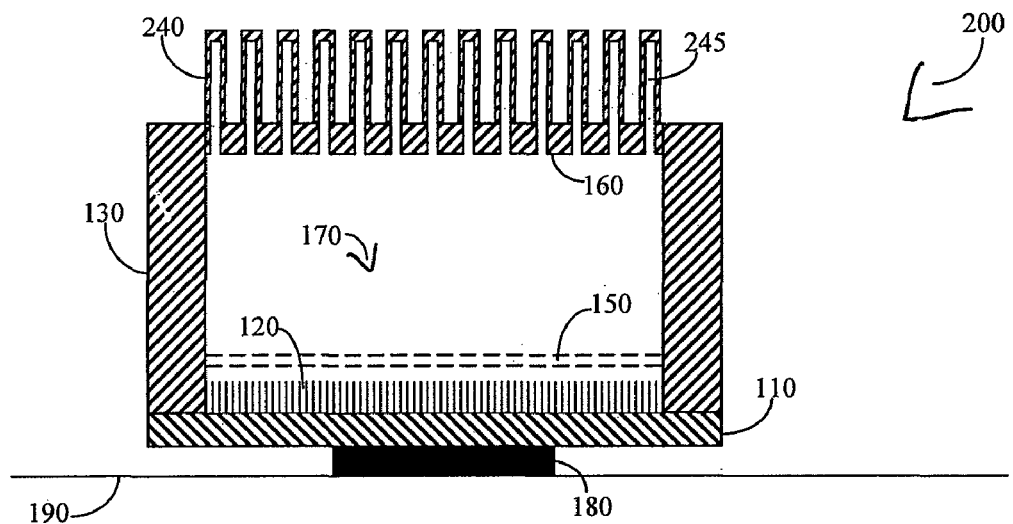
FIG. 2 is a side view in schematic form of a second embodiment of a vapor chamber heat sink according to the invention.

In yet another embodiment, as shown in to FIG. 2, each of the pin fins 240 has a cavity 245 that protrudes into the vapor chamber 170. This provides for greater cooling capabilities, as explained in greater detail below.

The principle of the operation of the heat sinks 100 or 200 is well-known in the art. Heat is transferred from the hot surface 180 through the substrate 110 to the CNTs 120. As a result, the vapor fluid 150 boils and the resulting vapor moves through the vapor chamber 170 and reaches the cooler surface 160 or 245, as the case may be. Upon coming in contact with the cooler surface, the vapor condenses and accumulates into drops that eventually return to the vapor fluid 150. This process of vapor returning to fluid and vice versa continues and assists in the cooling of the hot surface 180.

The specific design and physical dimensions of the vapor chamber 170 are determined as is well known in the existing art of heat pipe design, where the vapor chamber 170 is made in the shape of pipe, and an inner wall having a wick structure is added to the pipe. It is essential to design the hollow portions 245 of pin fins 240 such that vapor may still enter while the condensed drops slide down to return to the container of the vapor fluid 150.

In the invention herein, the vapor fluid 150 enables effective wetting of the CNTs. Therefore, vapor fluids such as isopropyl alcohol, acetone, or others with appropriate properties to wet CNTs, and with appropriate boiling and condensation temperatures, are used. The encapsulating structure and pin fins may be made of a solid slab of copper or other appropriate materials such as, but not limited to, AlSiC, SiC, Si, ceramics, and the like.

In one embodiment, the CNT array is grown in accordance with the principles disclosed in U.S. patent application Ser. No. 11/532,893, entitled Integrated circuit micro-cooler having tubes of a CNT array in essentially the same height over a surface, assigned to common assignee, and which is incorporated herein in its entirety by this reference thereto.

In another embodiment, a substrate having CNTs grown on both sides of the substrate may is used provide a better thermal path from the hot surface. Such CNT growth may be performed in accordance with the principles of a U.S. patent application Ser. No. 11/532,894, entitled An Integrated Circuit Micro-Cooler with Double-Sided Tubes of a CNT Array, assigned to common assignee, and which is incorporated herein in its entirety by this reference thereto.

In yet another embodiment, the substrate 110 comprises a CNT array 120 that is grown on both sides thereof in accordance with the principles disclosed in U.S. provisional patent application Ser. No. 60/908,966, filed on Mar. 29, 2007, entitled Double layer carbon nanotube-based structures and methods for removing heat from solid-state devices. Accordingly, one side of the substrate 110 is mounted against the hot surface of the solid state device 180 using pressure to eliminate the need for a thermal interface material to the vapor chamber 170. In another embodiment, the substrate 110, having a CNT array 120 grown on both sides of the substrate 110, is made of copper with a thickness in the range of 2-15 mm. In another embodiment of the disclosed invention, holes are drilled across a preferred direction of the substrate 110. Heat pipes can be inserted into substrate 110 to carry heat to other locations where an attachment to a heat sink with fins, for example fins 140, can be accommodated. In this case, the fins 140 of the vapor chamber 170 can be reduced in size.

Figure 3:
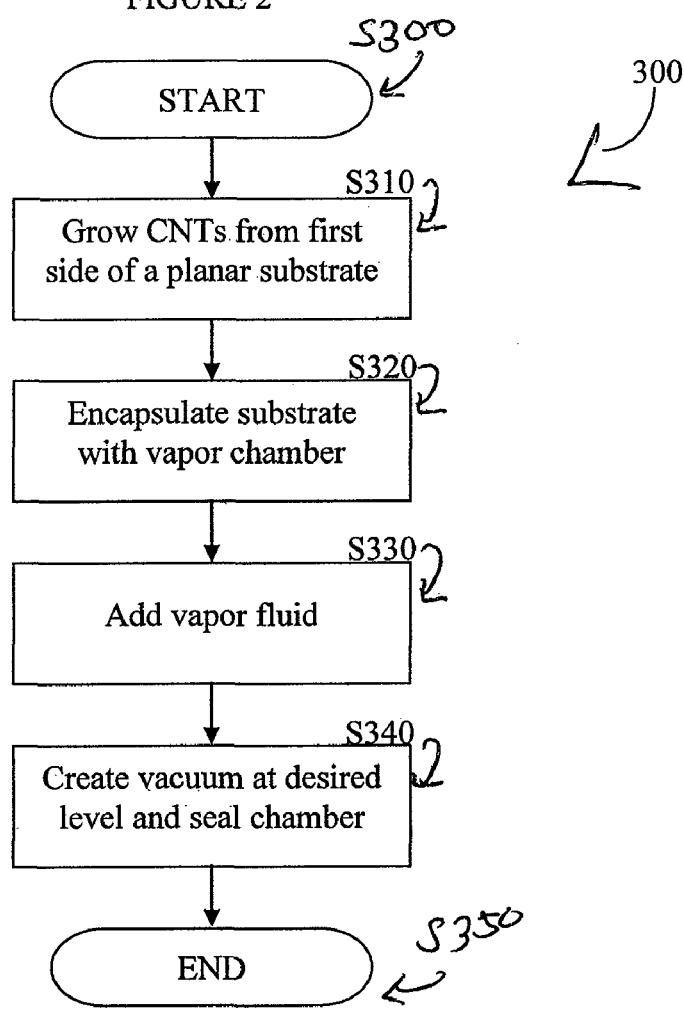
FIG. 3 is a flowchart showing the creation of a vapor chamber heat sink in accordance with the invention.

FIG. 3 is a flowchart 300 that describes the creation of a vapor chamber heat sink in accordance with the invention. The process begins in step S300. In step S310, a CNT array or forest is grown on an essentially planner surface of a metallic material, for example, copper. Preferably the CNTs are grown in accordance with the principles of the '581 patent. In step S320, the substrate, on top of which the CNTs are grown, is encapsulated by an encapsulating structure to form a vapor chamber, the CNTs being inside of the vapor chamber. A vapor fluid, such as isopropyl alcohol, acetone, or others with appropriate properties to wet CNTs, and with appropriate boiling and condensation temperatures, is added to the vapor chamber in step S330. In step S340, the vapor chamber is put under a desired level of vacuum and the chamber is then sealed. The use of a desired level of vacuum brings the system close to a desired boiling point of the vapor fluid. The process ends in step S330.

Figure 4:
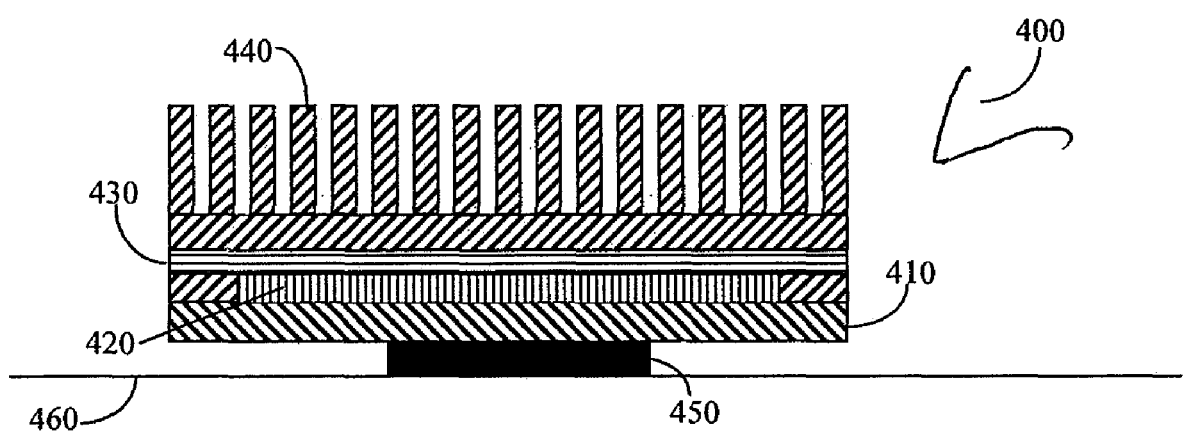
FIG. 4 is a side view in schematic form of a third embodiment of a vapor chamber heat sink according to the invention.

FIG. 4 shows another embodiment of the invention where, instead of the vapor chamber 170 of FIG. 1, a high conductivity material 430 is used. Accordingly, one side of the substrate 410, having CNTs 420 on one or both sides of the substrate 410, is pressed against the hot surface of, for example, the solid state device 450 that is mounted to a PCB 460. The opposing side of the substrate 410, with CNTs attached, is pressed against the flat surface 430, which is made of a high conductivity material to help dissipate heat in a direction that is essentially away from the hot surface 450. A heat sink 440 optionally comprised of fins further dissipates heat into the environment and away from the hot surface 450. Other principles of the invention discussed above can appropriately applied to this embodiment. For example, holes can be drilled in substrate 410 and heat pipes inserted therein for the purposes of effectively conducting heat from the hot surface 450 towards the heat sink 440.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

The invention claimed is:

1. A thermal transposer, comprising:
    a substrate;
    a plurality of carbon nanotubes individually grown on a first surface of said substrate in an orientation that is substantially parallel to a desired heat transfer axis of said thermal transposer;
    an encapsulating structure attached to said substrate together forming a sealed vapor chamber, wherein said carbon nanotubes are located inside of said sealed vapor chamber; and,
    a vapor fluid contained within said vapor chamber.

2. The thermal transposer of claim 1, further comprising:
    a plurality of pin fins attached to a surface of said encapsulating structure.

3. The thermal transposer of claim 2, said pin fins comprising an internal pipe that defines a condensation chamber having access to said vapor chamber, said condensation chamber comprising means for condensing said vapor fluid.

4. The thermal transposer of claim 3, further comprising a return path in said internal pipe of said fin pins for said condensed vapor fluid.

5. The thermal transposer of claim 1, said vapor fluid comprising one of:
    isopropyl alcohol and acetone.

6. The thermal transposer of claim 1, said vapor fluid wetting said carbon nanotubes.

7. The thermal transposer of claim 1, further comprising:
    a metallic coating over each of said carbon nanotubes.

8. The thermal transposer of claim 7, wherein said metallic coating comprises one of:
    titanium, palladium, and platinum.

9. The thermal transposer of claim 1, further comprising a plurality of carbon nanotubes individually grown on a second surface of said substrate, said second surface being opposite to said first surface.

10. The thermal transposer of claim 1, each of said plurality of carbon nanotubes comprising a length of between 100 and 700 microns.

11. The thermal transposer of claim 1, each of said plurality of carbon nanotubes comprising a length of greater than 700 microns.

12. The thermal transposer of claim 1, said substrate defining a plurality of holes formed across a preferred direction thereof.

13. The thermal transposer of claim 12, wherein said substrate is made of copper.

14. The thermal transposer of claim 13, wherein said substrate comprising a thickness of between 2 and 15 millimeters.

15. The thermal transposer of claim 12, further comprising:
    a plurality of heat pipes inserted into said holes.

16. A method for creating a thermal transposer comprising the steps of:
    individually growing a plurality of carbon nanotubes from a first surface of a substrate in an orientation substantially parallel to a desired heat transfer axis of said thermal transposer;
    forming an encapsulating structure;
    attaching said encapsulating structure to said substrate to form a vapor chamber that contains an array such that wherein said plurality of carbon nanotubes is contained therein;
    adding a vapor fluid to said vapor chamber;
    sealing said vapor chamber; and
    creating a desired level of vacuum in said vapor chamber.

17. The method of claim 16, further comprising the step of:
    attaching a plurality of pin fins to said encapsulating structure.

18. The method of claim 17, further comprising the step of:
    forming an internal pipe within said pin fins to define a condensation chamber that has access to said vapor chamber; and
    using said the condensation chamber to condense said vapor fluid.

19. The method of claim 18, further comprising the step of:
    forming a return path in said internal pipe of said fin pins to allow condensed vapor fluid to return to contact with said plurality of carbon nanotubes.

20. The method of claim 16, said vapor fluid comprising one of:
    isopropyl alcohol and acetone.

21. The method of claim 16, further comprising the step of:
    wetting said carbon nanotubes with said vapor fluid.

22. The method of claim 16, further comprising the step of:
    coating said carbon nanotubes with a metallic material.

23. The method of claim 21, said metallic coating comprising one of:
    titanium, palladium, and platinum.

24. The method of claim 16, further comprising the step of:
growing a plurality of carbon nanotubes from a second surface of said substrate, said second surface being opposite to said first surface.

25. The method of claim 16, further comprising the step of:
growing each of said plurality of carbon nanotubes to a length of between 100 and 700 microns.

26. The method of claim 16, further comprising the step of:
growing each of said plurality of carbon nanotubes to a length of greater than 700 microns.

27. The method of claim 16, further comprising the step of:
attaching said substrate to a hot surface.

28. The method of claim 16, said hot surface comprising a surface of an integrated circuit.

29. The method of claim 16, further comprising the step of:
drilling a plurality of holes across a preferred direction of said substrate.

30. The method of claim 29, wherein said substrate is made of copper.

31. The method of claim 30, said substrate comprising a thickness of between 2 and 15 millimeters.

32. The method of claim 29, further comprising the step of:
inserting a plurality of heat pipes into said holes.

* * * * *